(12) United States Patent
Tsuji

(10) Patent No.: US 8,057,564 B2
(45) Date of Patent: Nov. 15, 2011

(54) EXHAUST TRAP DEVICE

(75) Inventor: Norihiko Tsuji, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 308 days.

(21) Appl. No.: 12/435,454

(22) Filed: May 5, 2009

(65) Prior Publication Data
US 2009/0211213 A1    Aug. 27, 2009

Related U.S. Application Data

(62) Division of application No. 11/579,114, filed as application No. PCT/JP2005/008686 on May 12, 2005.

(30) Foreign Application Priority Data

May 12, 2004 (JP) .................................. 2004-141804

(51) Int. Cl.
B01D 50/00 (2006.01)
(52) U.S. Cl. ............................. 55/315; 55/385.2; 55/446
(58) Field of Classification Search ................ 55/315, 55/385.2, 445, 446
See application file for complete search history.

(56) References Cited

U.S. PATENT DOCUMENTS

| | | | |
|---|---|---|---|
| 5,522,934 A | 6/1996 | Suzuki et al. | |
| 5,819,683 A | 10/1998 | Ikeda et al. | |
| 6,332,925 B1 | 12/2001 | Noji et al. | |
| 6,488,745 B2 * | 12/2002 | Gu | ................................... 95/272 |
| 6,518,226 B2 | 2/2003 | Volker et al. | |
| 6,743,473 B1 | 6/2004 | Parkhe et al. | |
| 6,966,936 B2 | 11/2005 | Yamasaki et al. | |

FOREIGN PATENT DOCUMENTS

| | | |
|---|---|---|
| JP | 2-59002 | 2/1990 |
| JP | 2-61067 | 3/1990 |
| JP | 8-13169 | 1/1996 |
| JP | 8-24503 | 1/1996 |
| JP | 8-299784 | 11/1996 |
| JP | 9-96209 | 4/1997 |
| JP | 10-73078 | 3/1998 |
| JP | 2000-256856 | 9/2000 |
| JP | 2001-131748 | 5/2001 |
| JP | 2001-329367 | 11/2001 |

\* cited by examiner

Primary Examiner — Robert A Hopkins
(74) Attorney, Agent, or Firm — Oblon, Spivak, McClelland, Maier & Neustadt, L.L.P.

(57) ABSTRACT

Three exhaust trap units are arranged in series in an exhaust trap device for trapping substances solidified from exhaust gas and exhaust gas paths are formed inside the exhaust trap units. One or more collision plates are placed in each trap unit. The collision plates in each of the two upstream side exhaust trap units are arranged such that a space extending in the axial direction of the exhaust path is present therein without being blocked by any of the collision plates. The collision plates in the downstream side exhaust trap unit are arranged such that such a space is not present. Uneven distribution of the amount of accumulation of solidified substances is suppressed without performing complex control, and outflow of the solidified components to the downstream side of the exhaust trap device can be reliably reduced.

12 Claims, 7 Drawing Sheets

EXHAUST TRAP DEVICE

CROSS-REFERENCE TO RELATED APPLICATIONS

This application is a divisional of pending U.S. application Ser. No. 11/579,114 filed on Oct. 31, 2006, which comes into the national phase from the PCT Application No. PCT/JP2005/008686 filed on May 12, 2005 and claims priority to Japanese Patent Application No. 2004-141804 filed on May 12, 2004.

FIELD OF THE INVENTION

The present invention relates to an exhaust trap device; and, more particularly, to the structure of an exhaust trap device that exhibits enhanced trapping efficiency to thereby reduce outflow of solidified components toward a downstream side of the exhaust trap device.

BACKGROUND OF THE INVENTION

In general, various gas reaction apparatuses for forming films on a substrate or etching the substrate have been used as semiconductor manufacturing apparatuses. Typically, such a gas reaction apparatuses includes a gas supply unit, a hermetic gas reaction chamber supplied with a gas from the gas supply unit, an exhaust route connected to the gas reaction chamber and an evacuation device, such as a vacuum pump or the like, connected to the exhaust route.

Such gas reaction apparatuses suffer from a problem that reaction by-products are solidified from the exhaust gas discharged out of the gas reaction chamber and are accumulated in the exhaust route or the evacuation device, which may lead to clogging of the exhaust route or failure of the evacuation device. Taking this into account, an exhaust trap device is arranged midway of the exhaust route to perform the task of trapping the reaction by-products present in the exhaust gas (see JP8-13169A, JP8-24503A and JP8-299784A, for example). Most frequently used as such kind of exhaust trap device is a collision-type cooling and trapping device in which collision plates, such as baffle plates, fins or the like, are arranged within a casing in an intersecting relationship with respect to a flow direction of the exhaust gas. The device is constructed such that, as the exhaust gas collides against the collision plates and is subjected to cooling, given kinds of solidified substances can be accumulated on the surface of the collision plates. In this collision-type cooling and trapping device, the shape and arrangement of the collision plates is optimized so as to increase trapping efficiency, thereby reducing outflow of the solidified substances toward a downstream side of the device.

Also proposed are exhaust trap devices each having a plurality of exhaust trap sections arranged in series along an exhaust route (see JP10-73078A, JP2000-256856A, JP2001-131748A and JP2001-329367A, for example). Examples of such exhaust trap devices include a device that, by employing a plurality of serially arranged exhaust trap sections whose cooling temperatures differ from one another, can increase trapping efficiency or can allow the respective exhaust trap sections to trap different kinds of solidified substances (JP10-73078A, JP2000-256856A and JP2001-329367A) and a device that can improve maintainability by distributing the accumulation of solidified substances over a plurality of exhaust trap sections (JP2001-131748A).

In the collision-type cooling and trapping device referred to above, the exhaust gas introduced into the device through a gas inlet port makes contact with the collision plates within an exhaust path and is rapidly cooled down. For this reason, the reaction by-products are adhered to around the gas inlet port in large quantities and the exhaust path shows a reduced conductance. This makes it impossible to keep the gas reaction chamber arranged at the upstream side in a vacuum condition or causes clogging in the vicinity of entrance of the exhaust path, which in turn poses a problem that the exhaust trap device needs to be maintained at an increased frequency.

To avoid such a problem, there is a need to raise the cooling temperature in the exhaust path. However, if the temperature in the exhaust path is raised, the reaction by-products cannot be sufficiently trapped in the exhaust trap device and the reaction by-products are solidified in an evacuation device or a scrubber arranged at the downstream side of the exhaust trap device, which causes a shortened maintenance cycle or a failure of the evacuation device or a scrubber.

The trap device disclosed in JP2001-131748A includes a plurality of trap members arranged in multiple stages along a flow direction of the exhaust gas and also divided into multi-groups; heating units for independently heating the respective groups of trap members, excepting for the group of trap members positioned downstreammost in the flow direction of the exhaust gas; and a heat quantity controller for controlling the amount of heat generated by each heating units. This ensures that the reaction by-products are accumulated first on the downstreammost trap member and then on the upstream side trap members in sequence, thereby avoiding uneven distribution in the amount of accumulation of the solidified substances on the plurality of trap members. With this trap device, however, the heating units are required to be controlled in a time-dependent manner, which makes a control unit complicated, and further the control needs to be performed in a highly sophisticated fashion depending on the constituents of the exhaust gas. In addition, since above-noted structure is primarily focused on the avoidance of uneven distribution in the amount of solidified substances accumulated within the trap device, the device suffers from a drawback in that it is difficult to reduce the amount of reaction by-products solidified at a more downstream side than the downstreammost trap member.

SUMMARY OF THE INVENTION

In view of the foregoing problems, it is an object of the present invention to provide an exhaust trap device capable of suppressing uneven distribution in the amount of accumulation of solidified substances such as reaction by-products or the like without having to perform complicated control and reliably reduce outflow of the solidified substances toward a downstream side.

In accordance with the present invention, there is provided an exhaust trap device for trapping solidified substances from an exhaust gas passing through a gas exhaust route, including: a plurality of exhaust trap sections arranged in series along the exhaust route and having internally formed exhaust paths through which the exhaust gas passes, wherein the plurality of exhaust trap sections includes a first exhaust trap section arranged at an upstream side in a flow direction of the exhaust gas and a second exhaust trap section arranged at a downstream side in the flow direction of the exhaust gas, wherein the first exhaust trap section is provided with a multiple number of collision plates arranged to interrupt an exhaust gas flow moving along an axis of an exhaust path of the first exhaust trap section, the multiple number of collision plates being arranged such that a space extending continuously along the axis of the exhaust path without being interrupted by any of the collision plates arranged within the exhaust path exists in the exhaust path, and wherein the second exhaust trap section is provided with a plural number of collision plates arranged to interrupt an exhaust gas flow moving along an axis of an exhaust path of the second exhaust trap section, the plural number of collision plates being arranged such that a space extending continuously along the axis of the exhaust path without being interrupted by any of the collision plates arranged within the exhaust path does not exist in the exhaust path.

In accordance with the present invention, in the exhaust trap section provided at the upstream side, the specific arrangement pattern of the collision plates ensures that a part of the exhaust gas passes through the exhaust path without colliding against the collision plates. This reduces the amount of accumulation of solidified substances and helps avoid reduction in the conductance of the exhaust path and clogging of the exhaust path. On the other hand, in the exhaust trap section provided at the downstream side, the specific arrangement pattern of the collision plates makes sure that the entire exhaust gas is affected by the collision plates. Thus, the collision plates can promote creation of solidified substances from the exhaust gas and accumulation thereof, thereby reducing outflow of the solidified components toward the downstream side of the device. Accordingly, the amount of accumulation of the solidified substances are decreased in the upstream side exhaust trap section but increased in the downstream side exhaust trap section. This helps suppress uneven distribution in the amount of accumulation of the solidified substances between the exhaust trap sections, eventually reducing the frequency of maintenance. Further, even the uneven distribution in the amount of accumulation of the solidified substances is suppressed, the configuration of the collision plates in the downstream side exhaust trap section enables the reduction of the outflow of the solidified components toward the downstream side of the device. This makes it possible to prevent failure of an evacuation device or a scrubber arranged at the downstream side of the device, thus relieving the maintenance demand for these devices.

It is preferable that the plurality of exhaust trap sections are constructed to be coupled to and separated from one another. This makes it possible to change the number of the exhaust trap sections or to replace the exhaust trap sections with the ones having the collision plates of different shapes or arrangement patterns, depending on the circumstances, e.g., the components or temperature of the exhaust gas. As a consequence, the accumulation of solidified substances can be adjusted to thereby optimize the system for the reduction of the maintenance frequency and the outflow of the solidified components.

In accordance with the invention, an exhaust trap device for trapping solidified substances from an exhaust gas passing through a gas exhaust route, including: a plurality of exhaust trap sections arranged in series along the exhaust route, each section having an internally formed exhaust path through which the exhaust gas passes, wherein the plurality of exhaust trap sections includes a first exhaust trap section arranged at an upstream side in a flow direction of the exhaust gas and a second exhaust trap section arranged at a downstream side in the flow direction of the exhaust gas, wherein each of the first and the second exhaust trap section is provided with collision plates, and wherein angles that an axis of an exhaust path makes with respect to the collision plates in the second exhaust trap section are greater than angles that an axis of an exhaust path makes with respect to the collision plates in the first exhaust trap section.

In accordance with the present invention, the inclination angles that the collision plates make with respect to the axis of the exhaust path in the upstream side exhaust trap section are small. Therefore, the collision plates serve as rectifying plates that rectify the exhaust gas flow without interrupting same, while presence of the collision plates increases the surface area of the exhaust path in contact with the exhaust gas, assuring the action of accumulation of solidified substances. Use of the rectifying plates makes it possible to ameliorate uneven distribution of the solidified substances within the exhaust path and also to control the amount of accumulation of the solidified substances, thus avoiding reduction in the conductance of the exhaust path or clogging of the exhaust path. On the other hand, the inclination angles that the collision plates make with respect to the axis of the exhaust path in the downstream side exhaust trap section are large. For this reason, the exhaust gas flow is interrupted by the collision plates, which allows the solidified substances to be accumulated efficiently. Accordingly, the amount of accumulation of the solidified substances is decreased in the upstream side exhaust trap section but increased in the downstream side exhaust trap part. This helps suppress uneven distribution in the amount of accumulation of the solidified substances between the exhaust trap sections, eventually reducing the frequency of maintenance. Further, even the uneven distribution in the amount of accumulation of the solidified substances is suppressed, the collision plates in the downstream side exhaust trap section are still able to reduce outflow of the solidified components toward the downstream side of the device. This makes it possible to prevent failure of an evacuation device or a scrubber arranged at the downstream side of the device, thus relieving the maintenance demand for these devices. The collision plates of the upstream side exhaust trap section may be arranged in parallel to the axis of the corresponding exhaust path.

In this case, it is preferable that the first and the second exhaust trap section are arranged such that one section is disposed outside the other section to surround same and a path inverting portion for inverting the flow direction of the exhaust gas is provided between the first exhaust trap section and the second exhaust trap section. This ensures that the two exhaust trap sections of the upstream and the downstream side can be configured compact and also integrated with each other.

In this case, it is also preferable that the path inverting portion is connected with the entire perimeters of the first exhaust trap section and the second exhaust trap section. With this configuration, the path inverting portion allows the exhaust gas to flow from the upstream side exhaust trap section toward the downstream side exhaust trap section over their entire perimeters, thus making it possible to increase the cross sectional passage area of the path inverting portion. This also reduces unbalance of the exhaust gas flow at the downstream portion of the upstream side exhaust trap section and at the upstream portion of the downstream side exhaust trap section, thereby avoiding reduction in the conductance of the respective sections or clogging of the exhaust paths.

In each of the inventions, it is preferable that the collision plates are arranged to allow the exhaust gas to spirally flow within the exhaust path in which the collision plates are arranged. This can creates a vortex flow of the exhaust gas within the exhaust path, thus promoting accumulation of the solidified substances and reducing the outflow of the solidified components toward the downstream side of the device. In this case, the vortex flow may be created by a plurality of spirally arranged collision plates or by a single spiral collision plate.

In accordance with the present invention, there is further provided a gas reaction apparatus including: a gas supply unit; a gas reaction chamber in which gases supplied from the gas supply unit are reacted; an exhaust route associated with the gas supply unit or the gas reaction chamber; and one of the exhaust trap devices described above, the one of the exhaust trap devices being arranged on the exhaust route. Examples of the gas reaction apparatus include a gas film forming apparatus for forming a film on a substrate placed within a gas reaction chamber and a gas etching apparatus for etching a surface of a substrate. In particular, it is preferable that the gas reaction apparatus is applied to a variety of semiconductor manufacturing apparatuses employed in a semiconductor manufacturing process.

In accordance with the present invention, it is possible to attain an excellent effect in realizing an exhaust trap device that can suppress uneven distribution in the amount of accumulation of solidified substances of reaction by-products or the like without performing any complicated control and can reliably reduce the outflow of the solidified components toward a downstream side of the device.

DESCRIPTION OF REFERENCE CHARACTERS

Figure 1:
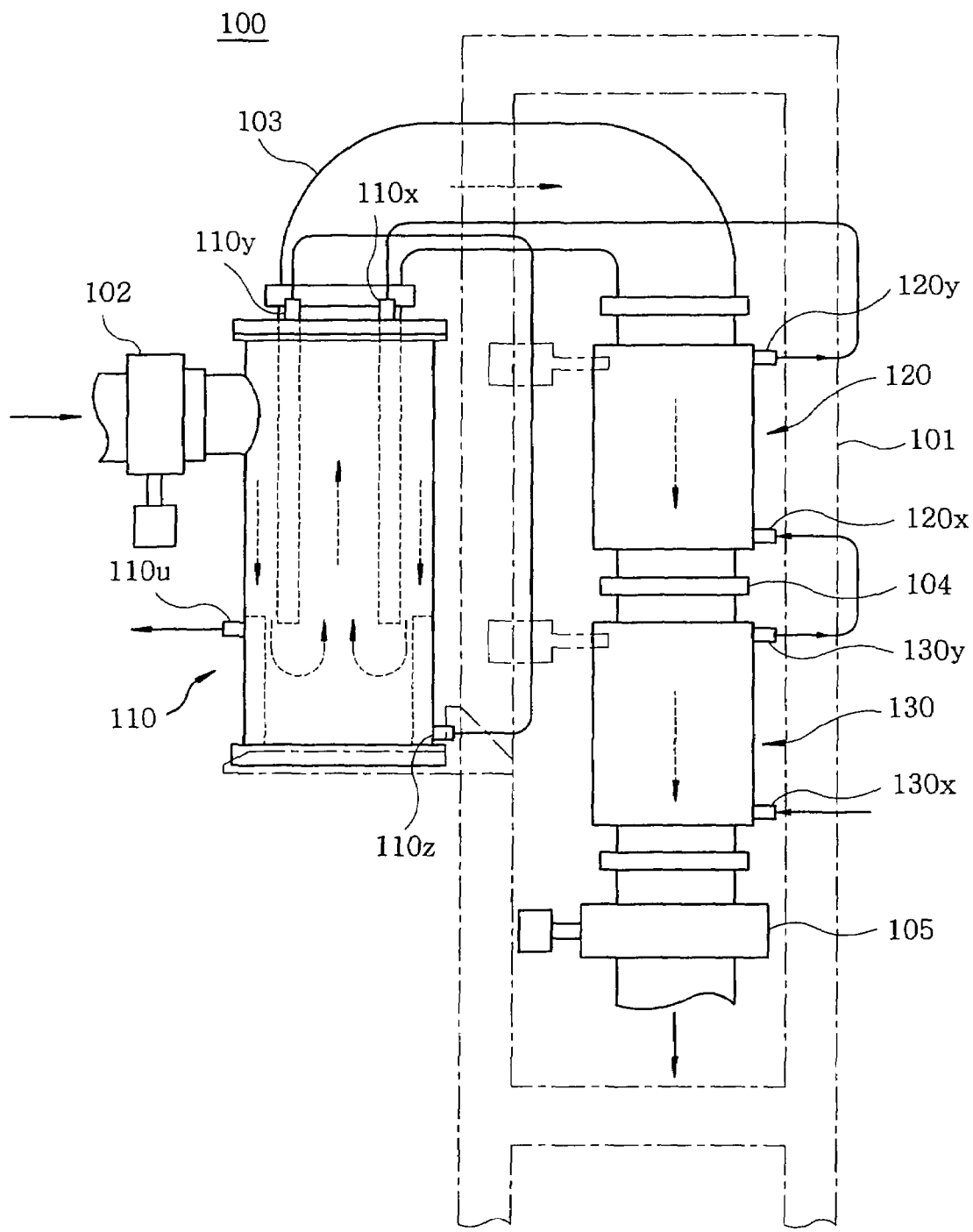
FIG. 1 is a side view showing the overall configuration of an exhaust trap device in accordance with an embodiment of the present invention.

100 Exhaust trap device
110 First trap unit
120 Second trap unit
130 Third trap unit
11X, 11Z, 12X, 13X Exhaust path
11Y Path inverting portion
113 Outer tube
114a, 114b, 114c, 115 Rectifying plate (Collision plate)
116, 124, 134 Collision plate

DETAILED DESCRIPTION OF THE PREFERRED EMBODIMENTS

An embodiment of the present invention will now be described with reference to the accompanying drawings. FIG. 1 is a side view showing the overall configuration of an exhaust trap device 100 in accordance with an embodiment of the present invention. The exhaust trap device 100 includes a first trap unit 110, a second trap unit 120 and a third trap unit 130 arranged in series along an exhaust route of a gas. The first trap unit 110, the second trap unit 120 and the third trap unit 130 are combined together as a single unit by means of a frame 101. Accordingly, each of the trap units can be separated by releasing them from the frame 101. The first trap unit 110 has a gas inlet port connected to a downstream side of a valve 102 which may be a butterfly valve. The first trap unit 110 has a gas outlet port connected to a gas inlet port of the second trap unit 120 through a "U"-shaped exhaust line 103. The second trap unit 120 has a gas outlet port connected to a gas inlet port of the third trap unit 130 through a joint flange 104. A valve 105 is provided at the downstream side of the third trap unit 130. The valve 105 can be a butterfly valve.

Figure 2:
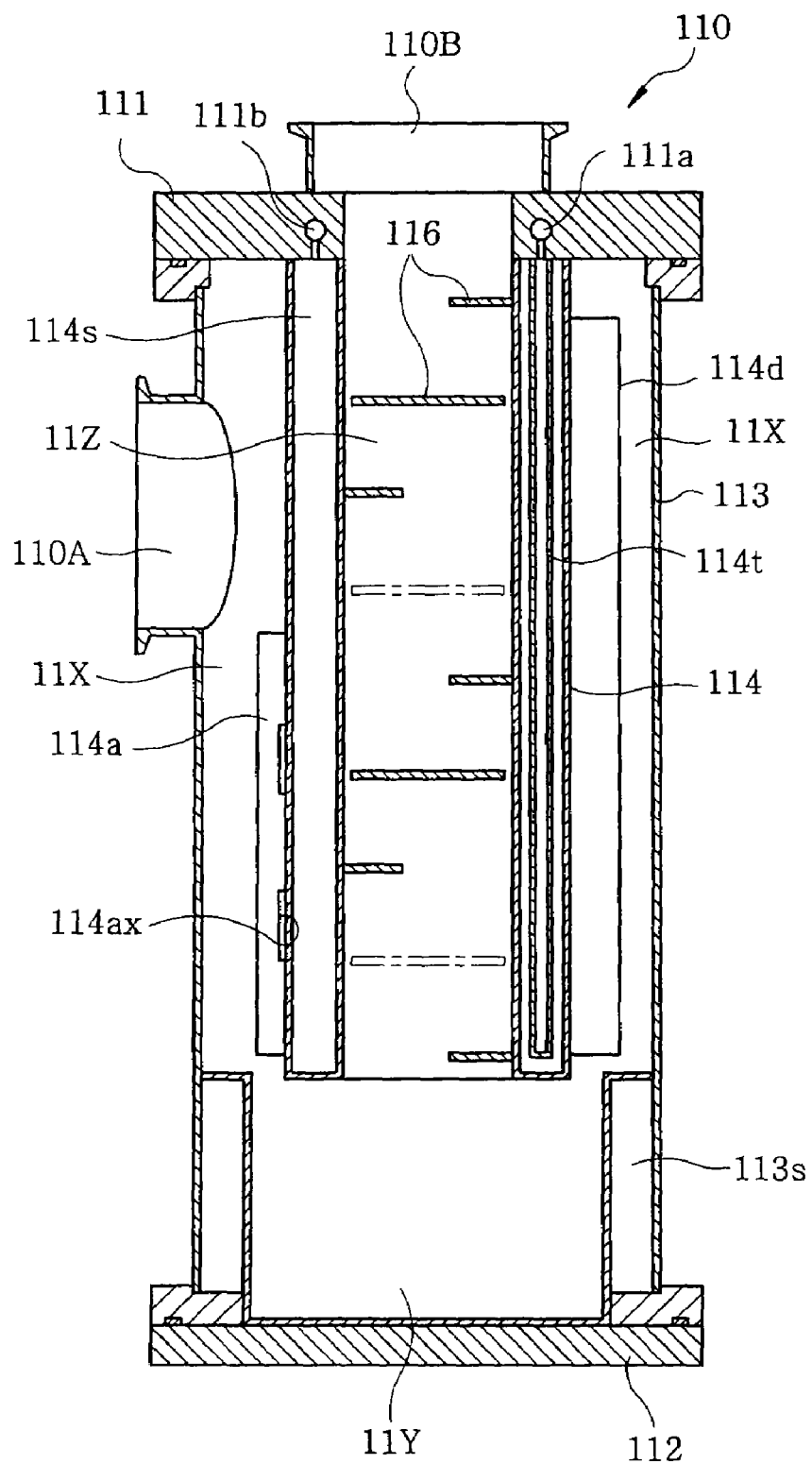
FIG. 2 is a vertical cross sectional view depicting a first trap unit of the exhaust trap device shown in FIG. 1.
Figure 3:
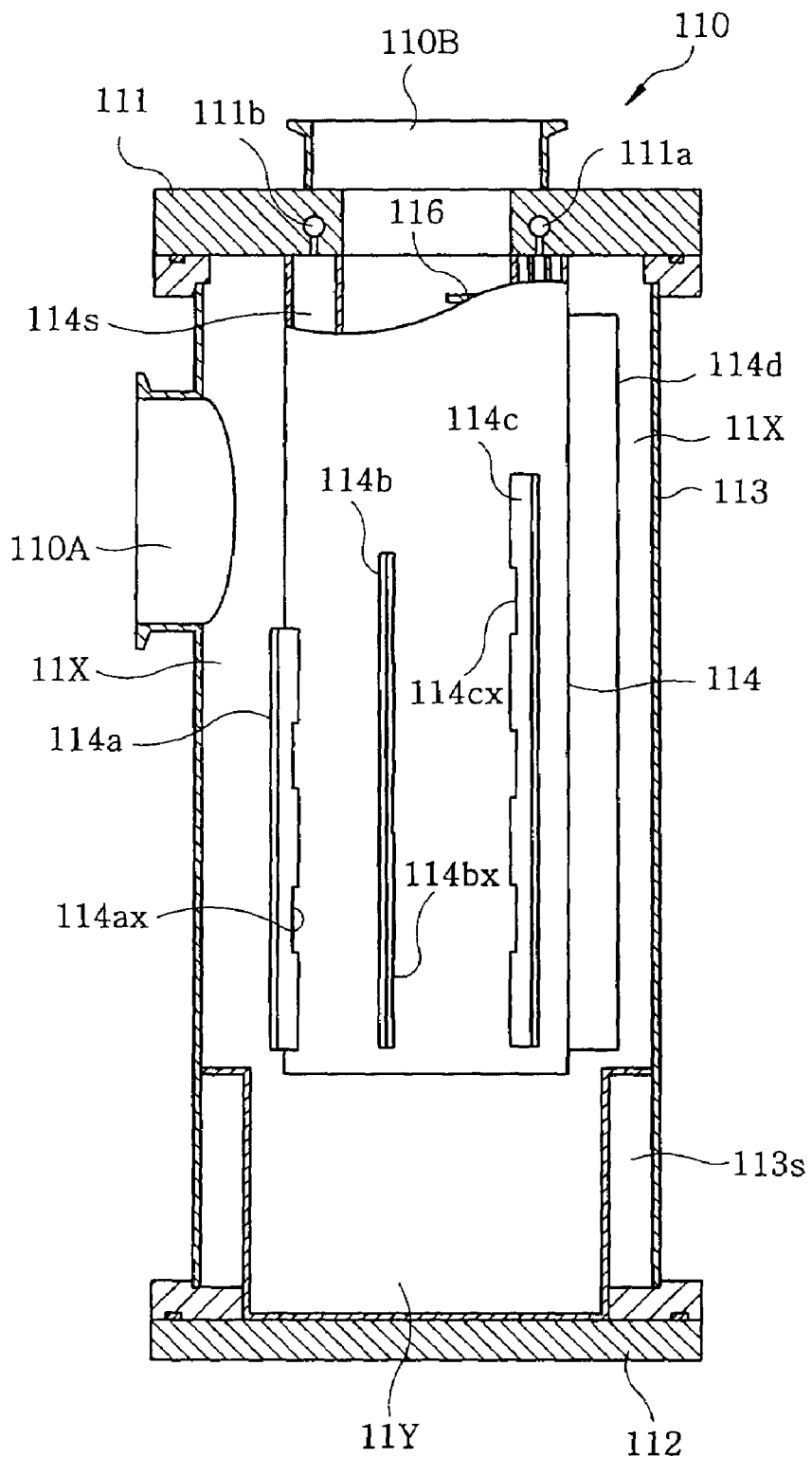
FIG. 3 is a partial cross sectional view illustrating fins arranged on an inner tube of the first trap unit of the exhaust trap device shown in FIG. 1.
Figure 4:
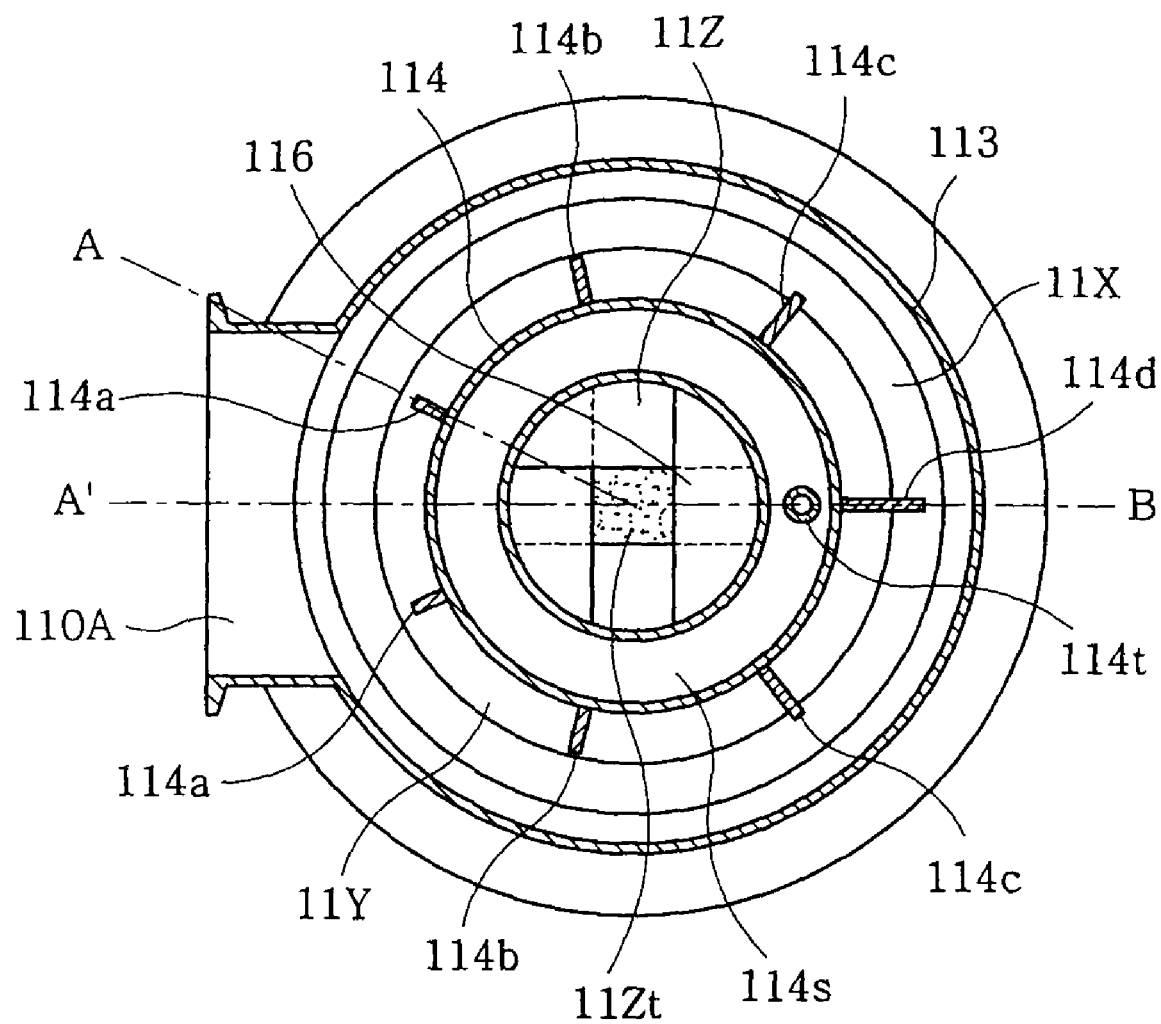
FIG. 4 is a horizontal cross sectional view showing the first trap unit of the exhaust trap device shown in FIG. 1.

FIG. 2 is a vertical cross sectional view depicting an internal structure of the first trap unit 110. FIG. 3 is a partial cross sectional view illustrating the internal structure of the first trap unit 110. FIG. 4 is a horizontal cross sectional view showing the first trap unit 110. FIG. 2 depicts a cross section taken along the line A-B in FIG. 4, while FIG. 3 illustrates a cross section of an outer tube taken along the line A'-B in FIG. 4 and a side profile of an inner tube.

The first trap unit 110 is of a dual tube structure having an outer tube 113 and an inner tube 114. The outer tube 113 is connected to end plates 111 and 112 at its opposite end portions, thus forming a cylindrical case whose opposite ends are closed. A gas inlet port 110A is formed at the portion of the outer tube 113 closer to the end plate 111. An exhaust path 11X having a ring-like cross section is formed between the outer tube 113 and the inner tube 114. Ring-shaped collision plates or fins (not shown) may be provided at a portion of the inner circumferential surface of the outer tube 113, which faces the inner tube 114 and is closer to the end plate 112 than the gas inlet port 110A. The outer tube 113 has an extension section extending in an axial direction beyond the end portion of the inner tube 114 at the side of the end plate 112. The internal space defined by the extension section acts as a path inverting portion 11Y which is connected with the downstream side of the exhaust path 11X. The path inverting portion 11Y has a function of receiving reaction by-products trapped in and peeled off from the exhaust path 11X at the upstream side thereof. As illustrated, a coolant path 113s may be formed within a wall of the outer tube 113 around the path inverting portion 11Y in such a manner that a coolant such as water or the like can flow through the coolant path 113s. A ring-shaped collision plates or fins (not shown) can be provided in the path inverting portion 11Y.

The inner tube 114 is not supported by the end plate 112 but by the end plate 111. At the side of the end plate 111, the inner tube 114 has an opening that communicates with a gas outlet port 110B through a hole formed through the end plate 111. At the side of the end plate 112, the inner tube 114 has an opening facing to the end plate 112 via the path inverting portion 11Y. A coolant path 114s is formed within a wall of the inner tube 114. Arranged on an external surface of the inner tube 114 are rectifying plates 114a, 114b, 114c and 114d each extending in the flow direction of an exhaust gas (in a downward direction in FIGS. 2 and 3) within the exhaust path 11X, namely in an axial direction of the inner tube 114 (which coincides with an axial direction of the exhaust path 11X). It is to be noted that, although the rectifying plates 114a, 114b, 114c and 114d are most preferably extended in the axial direction of the inner tube 114 (i.e., the angle being zero between the axis of the exhaust path 11X and the rectifying plates 114a, 114b, 114c, 114d), it will be appropriate that the planes on which the rectifying plates lie are not perpendicular to the axis of the inner tube 114. Therefore, the planes on which the rectifying plates lie may make a predetermined angle with respect to the axis of the inner tube 114, for example. In case that the rectifying plates are slanted to the axis of the inner tube 114 in this manner, it is advantageous to make the predetermined angle as small as possible and, more concretely, the predetermined angle is preferably no greater than 45 degrees. Furthermore, the planes on which the rectifying plates lie may be curved ones. For the purpose of describing the embodiment in the subject specification, two different terms, "rectifying plates" and "collision plates" are used to define plate-like bodies affecting the exhaust gas flow within the exhaust path. It should be appreciated, however, that the two terms are distinguished from each other only by the angle of the plate-like bodies with respect to the axis of the exhaust path in which the plate-like bodies are arranged. Thus, no clear demarcation line exists between the two terms and, in this context, the "rectifying plates" may be regarded as the "collision plates" that make a zero angle or a small angle with respect to the axis of the exhaust path.

As shown in FIG. 3, among these rectifying plates, the rectifying plate 114a located closest to the gas inlet port 110A is extended at the portion of the inner tube 114 that does not face the gas inlet port 110A. The rectifying plate 114b positioned farther from the gas inlet port 110A than the rectifying plate 114a extends closer to the end plate 111 than the rectifying plate 114a. The rectifying plate 114c lying farther from the gas inlet port 110A than the rectifying plate 114b extends closer to the end plate 111 than the rectifying plate 114b. The rectifying plate 114d arranged farthest from the gas inlet port 110A, i.e., disposed at a diametrically opposite side of the gas inlet port 110A, extends closer to the end plate 111 than the rectifying plate 114c. By not providing rectifying plates within a predetermined extent around the gas inlet port 110A in this way, the rectifying plates cause no hindrance to the flow of the exhaust gas introduced from the gas inlet port 110A.

As depicted in FIG. 4, the closer to the gas inlet port 110A the rectifying plates are located, the smaller the rectifying plates protrude into the exhaust path 11X. In other words, the rectifying plate 114a protrudes in a smaller amount than the rectifying plate 114b. The rectifying plate 114b protrudes in a smaller amount than the rectifying plate 114c. The rectifying plate 114c protrudes into a shorter distance than the rectifying plate 114d. Due to this feature, the exhaust gas introduced from the gas inlet port 110A are readily spread over the entire cross section of the exhaust path 11X, thereby preventing the solidified substances from being intensively accumulated on and thus clogging a specific area of the exhaust path 11X (e.g., an area in the vicinity of the gas introduction port 110A).

Furthermore, the rectifying plates 114a, 114b and 114c are provided with slits 114ax, 114bx and 114cx formed between themselves and the outer circumference of the inner tube 114. These slits are provided in plural numbers with intervals therebetween along the length direction of each of the rectifying plates. Although the rectifying plate 114d has no slit in the illustrated embodiment, slits may also be provided on the rectifying plate 114d. Provision of the slits 114ax, 114bx and 114cx allows parts of the exhaust gas to pass through the rectifying plates 114a, 114b and 114c. This enables the exhaust gas to uniformly flow through the exhaust path 11X, making it possible to efficiently trap the reaction by-products.

Moreover, although each of the rectifying plates 114a, 114b, 114c and 114d of the illustrated embodiment is formed continuously along a single generatrix on the outer circumference of the inner tube 114, but is not limited thereto. Alternatively, a plurality of short rectifying plates may be arranged spaced apart along a single generatrix (namely, in the axial direction of the inner tube 114). As a further alternative, a plurality of short rectifying plates may be arranged on the outer circumference of the inner tube 114 in a lattice shape. However, it is preferred that each of the short rectifying plates extends in the axial direction of the inner tube 114.

An exhaust path 11Z is defined inside the inner tube 114. The exhaust path 11Z extends long in a rectilinear manner, from a position where it is opened toward the path inverting portion 11Y at the side of the end plate 112 to a position where it adjoins the gas outlet port 110B. In the exhaust path 11Z, a plurality of collision plates 116 are arranged in such a manner as to make a predetermined angle (a right angle in the illustrated example) with respect to the axial direction of the exhaust path 11Z (the up-down direction in FIGS. 2 and 3). As illustrated in FIGS. 2 and 4, each of the collision plates 116 is shaped to block only a part of the cross section of the exhaust path 11Z. When viewed in the axial direction of the exhaust path 11Z, at least a part of the area blocked by one of the collision plates 116 is out of alignment with the area blocked by another collision plate 116 neighboring the one collision plate in the axial direction of the exhaust path 11Z. In the illustrated embodiment, the plurality of collision plates 116 are arranged in a spiral shape about the axis of the exhaust path 11Z at different angular positions, whereby a vortex flow of the exhaust gas is created within the exhaust path 11Z. In the example shown in the drawings, the angular positions of two neighboring collision plates 116 are deviated from each other by 90 degrees. The plurality of the collision plates 116 are formed of identically shaped plate-like bodies and are attached to the inner circumference of the inner tube 114. Most preferably, each of the collision plates 116 is arranged on a plane perpendicularly intersecting the axis of the exhaust path 11Z. However, it will be appropriate if the angles that the planes on which the collision plates 116 are arranged make with respect to the axis of the exhaust path 11Z are greater than those that the planes on which the rectifying plates 114a, 114b, 114c and 114d are arranged make with respect to the axis of the exhaust path 11X; and the angles are preferably greater than 45 degrees. Furthermore, the planes on which the collision plates 116 lie may be curved ones.

The plurality of collision plates 116 are arranged within the exhaust path 11Z in such a manner that there exists in the exhaust path 11Z a space extending continuously in the axial direction of the exhaust path 11Z without being interrupted by any of the collision plates 116 arranged within the exhaust path 11Z. This space can be recognized as the area of a rectangular or square cross section designated by the reference character 11Zt in FIG. 4. In the illustrated embodiment, the space 11Zt extends rectilinearly so that at least a part of the exhaust gas introduced into the exhaust path 11Z can directly pass through the exhaust path 11Z without being blocked by the collision plates 116. The space 11Zt extends through the center region of the exhaust path 11Z. Provision of the space 11Zt suppresses the trapping action from intensively occurring within the exhaust path 11Z and thus allows the trapping action to be also carried out at the downstream side of the exhaust path 11Z of the exhaust trap device 100.

In the present embodiment, the exhaust path 11X defined between the outer tube 113 and the inner tube 114 communicates with the exhaust path 11Z defined inside the inner tube 114 through the path inverting portion 11Y. In particular, the path inverting portion 11Y allows the exhaust path 11X and the exhaust path 11Z to communicate with each other over their entire perimeters. The path inverting portion 11Y is formed of a space defined inside the extended section of the outer tube 113 which extends longer in the axial direction than the end portion of the inner tube 114. Rectifying plates may be provided on the inner circumference of the outer tube 113 adjoining the path inverting portion 11Y.

As shown in FIG. 2, the coolant path 114s formed within the wall of the inner tube 114 communicates with a flow path inlet 111a provided inside the end plate 111 via a pipe 114t. The pipe 114t extends from the flow path inlet 111a into the coolant path 114s. The coolant path 114s is also in communication with a flow path outlet 111b formed inside the end plate 111. The flow path inlet 111a is connected to a coolant inlet port 110x shown in FIG. 1, while the flow path outlet 111b is connected to a coolant outlet port 110y illustrated in FIG. 1. Furthermore, the coolant path 113s of the outer tube 113 arranged outside the path inverting portion 11Y is connected to a coolant inlet port 110z and a coolant outlet port 110u as depicted in FIG. 1. This structure ensures that a coolant is introduced into the bottom of the coolant path 114s via the pipe 114t and then flows toward the top of the coolant path 114s. Thus, it is possible to suppress occurrence of convection of the coolant within the coolant path 114s, which helps to efficiently perform a cooling operation.

As set forth above, the first trap unit 110 includes one exhaust trap section having the exhaust path 11X defined between the outer tube 113 and the inner tube 114 and the other exhaust trap section having the exhaust path 11Z defined inside the inner tube 114. In other words, the exhaust path 11X is arranged to surround the exhaust path 11Z. The rectifying plates 114a, 114b, 114c and 114d are arranged in the exhaust path 11X so as to extend along the flow direction of the exhaust gas. Further, the exhaust path 11Z is connected to the downstream side of the exhaust path 11X through the path inverting portion 11Y. The collision plates 116 for baffling the flow of the exhaust gas are arranged in the exhaust path 11Z. The flow direction of the exhaust gas in the exhaust path 11X is opposite to that in the exhaust path 11Z.

Figure 5A:
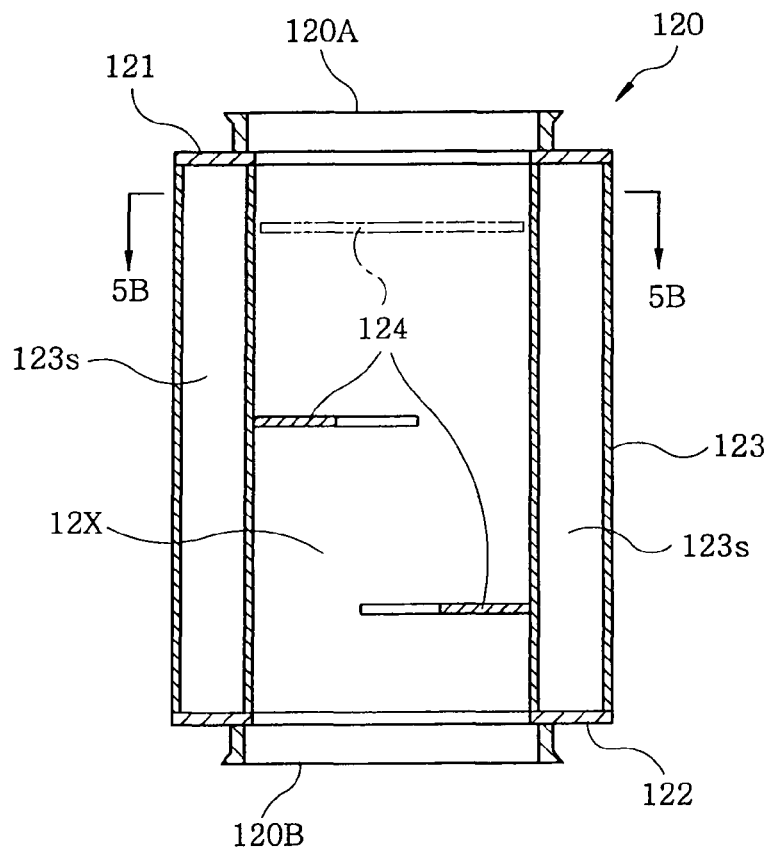
FIGS. 5A and 5B are vertical and horizontal cross sectional views of a second trap unit of the exhaust trap device shown in FIG. 1.
Figure 5B:
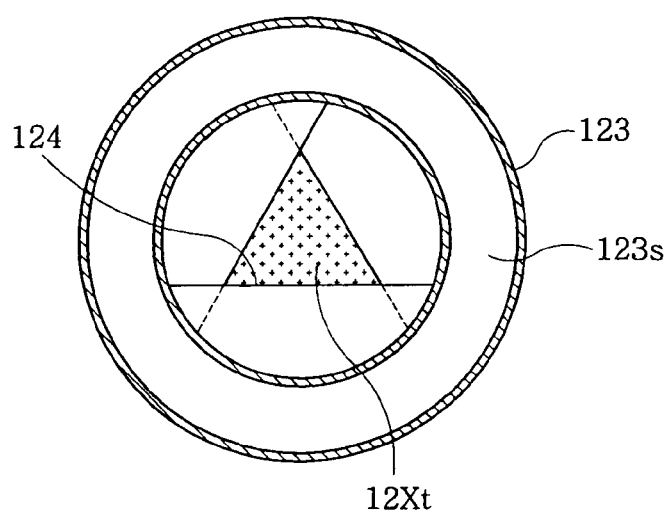

Next, the structure of the second trap unit 120 will be described with reference to FIGS. 5A and 5B. The second trap unit 120 includes an end plate 121 having an opening adjacent to a gas inlet port 120A, an end plate 122 having an opening adjacent to a gas outlet port 120B, and an outer wall 123 connected at its opposite ends to the end plates 121 and 122. A coolant path 123s is formed within the outer wall 123. The coolant path 123s is connected to a coolant inlet port 120x and a coolant outlet port 120y illustrated in FIG. 1.

An exhaust path 12X is defined inside the second trap unit 120 between the gas inlet port 120A and the gas outlet port 120B. The exhaust path 12X is formed in a rectilinear shape. Alternatively, the exhaust path 12X may be of a spiral shape or a curved shape. Arranged within the exhaust path 12X are collision plates 124 that serve to block only parts of the cross section of the exhaust path 12X. As illustrated in FIG. 5B, each of the collision plates 124 is shaped to block only a part of the cross section of the exhaust path 12X. When viewed in the axial direction of the exhaust path 12X, at least a part of the area blocked by one of the collision plates 124 is out of alignment with the area blocked by another collision plate 124 neighboring the one collision plate in the axial direction of the exhaust path 12X. In the illustrated embodiment, the plurality of collision plates 124 are arranged in a spiral shape about the axis of the exhaust path 12X at different angular positions. In the example shown in the drawings, the angular positions of two neighboring collision plates 124 are deviated from each other by 120 degrees. The plurality of the collision plates 124 are formed of identically shaped plate-like bodies and are attached to the inner circumference of the outer wall 123. Most preferably, each of the collision plates 124 is arranged on a plane perpendicularly intersecting the axis of the exhaust path 12X. However, it will be appropriate if the angles that the planes on which the collision plates 124 are arranged make with respect to the axis of the exhaust path 12X are greater than those that the planes on which the rectifying plates 114a, 114b, 114c and 114d are arranged make with respect to the axis of the exhaust path 11X; and the angles are preferably greater than 45 degrees. Furthermore, the planes on which the collision plates 124 lie may be curved ones.

The plurality of collision plates 124 are arranged within the exhaust path 12X in such a manner that there exists in the exhaust path 12X a space extending continuously in the axial direction of the exhaust path 12X without being interrupted by any of the collision plates 124 arranged within the exhaust path 12X. This space can be recognized as the area of a triangular, particularly, equilateral triangular cross section designated by the reference character 12Xt in FIG. 5B. In the illustrated embodiment, the space 12Xt extends rectilinearly so that at least a part of the exhaust gas introduced into the exhaust path 12X can directly pass through the exhaust path 12X without being blocked by the collision plates 124. The space 12Xt extends through the center region of the exhaust path 12X. Provision of the space 12Xt suppresses the trapping action from intensively occurring within the exhaust path 12X and thus allows the trapping action to be also carried out at the downstream side of the exhaust path 12X of the exhaust trap device 100.

Figure 6A:
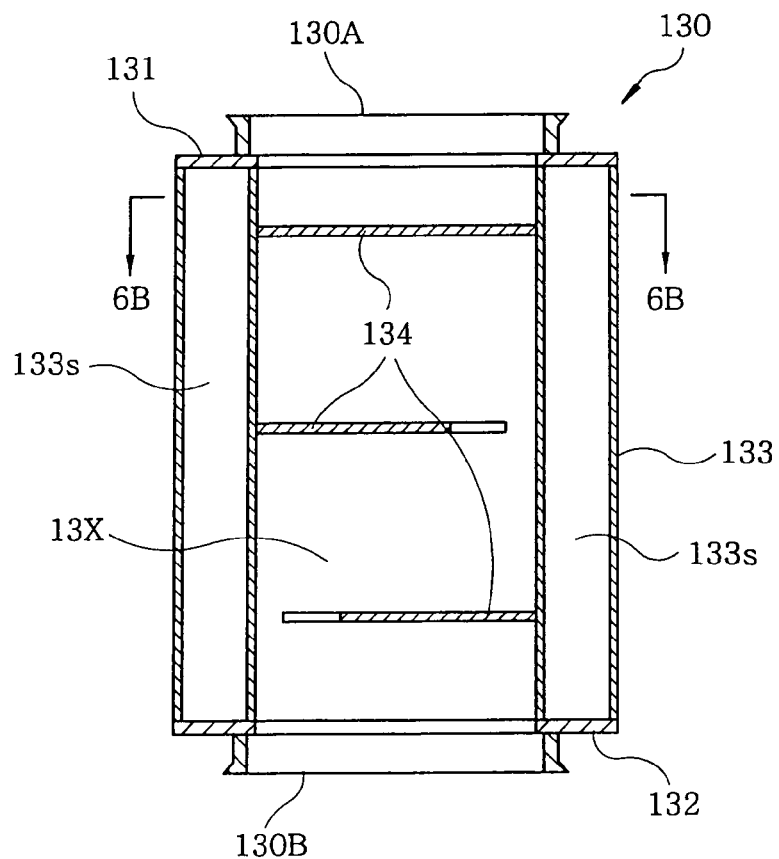
FIGS. 6A and 6B are vertical and horizontal cross sectional views of a third trap unit of the exhaust trap device shown in FIG. 1.
Figure 6B:
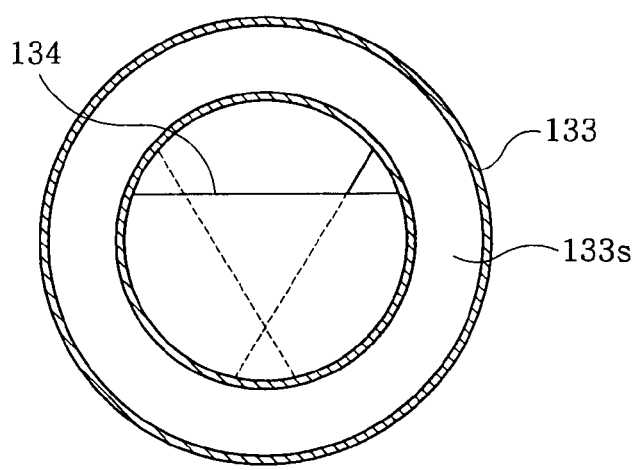

Next, the structure of the third trap unit 130 will be described with reference to FIGS. 6A and 6B. The third trap unit 130 includes an end plate 131 having an opening adjacent to a gas inlet port 130A, an end plate 132 having an opening adjacent to a gas outlet port 130B, and an outer wall 133 connected at its opposite ends to the end plates 131 and 132. A coolant path 133s is formed within the outer wall 133. The coolant path 133s is connected to a coolant inlet port 130x and a coolant outlet port 130y as illustrated in FIG. 1.

An exhaust path 13X is defined inside the third trap unit 130 between the gas inlet port 130A and the gas outlet port 130B. The exhaust path 13X is formed in a rectilinear shape. Alternatively, the exhaust path 13X may be of a spiral shape or a curved shape. Arranged within the exhaust path 13X are collision plates 134 that serve to block only parts of the cross section of the exhaust path 13X. As illustrated in FIG. 6B, each of the collision plates 134 is shaped to block only a part of the cross section of the exhaust path 13X. When viewed in the axial direction of the exhaust path 13X, at least a part of the area blocked by one of the collision plates 134 is out of alignment with the area blocked by another collision plate 134 neighboring the one collision plate in the axial direction of the exhaust path 13X. In the illustrated embodiment, the plurality of collision plates 134 are arranged in a spiral shape about the axis of the exhaust path 13X at different angular positions. In the example shown in the drawings, the angular positions of two neighboring collision plates 134 are deviated from each other by 120 degrees. The plurality of collision plates 134 are formed of identically shaped plate-like bodies and are attached to the inner circumference of the outer wall 133. Most preferably, each of the collision plates 134 is arranged on a plane perpendicularly intersecting the axis of the exhaust path 13X. However, it will be good if the angles that the planes of the collision plates 134 make with respect to the axis of the exhaust path 13X are greater than those that the planes of the rectifying plates 114a, 114b, 114c and 114d make with respect to the axis of the exhaust path 11X; and the angles are preferably greater than 45 degrees. Furthermore, the planes on which the collision plates 134 lie may be curved ones.

In the exhaust path 13X, there exists no such space as the spaces 11Zt and 12Xt employed in the first trap unit 110 and the second trap unit 120 and adapted to extend continuously through the exhaust paths in the axial directions thereof without being interrupted by any of the collision plates. In other words, in the exhaust path 13X all of the lines extending in the axial direction of the exhaust path 13X intersect the collision plates 134. Thus, even a part of the exhaust gas introduced into the exhaust path 13X is not allowed to pass through the exhaust path 13X without being interrupted by the collision plates 134, which means that the entire exhaust gas is deflected by the collision plates 134 while moving forward through the exhaust path 13X.

In the exhaust trap device 100 noted above, the first trap unit 110, the second trap unit 120 and the third trap unit 130 are arranged in the named sequence along the exhaust route. More specifically, the exhaust trap section provided in the exhaust path 11X of the first trap unit 110, the exhaust trap section provided in the exhaust path 11Z of the first trap unit 110, the exhaust trap section provided in the exhaust path 12X of the second trap unit 120 and the exhaust trap section provided in the exhaust path 13X of the third trap unit 130 are arranged one after another along the exhaust route.

In the present embodiment, the interior of the respective trap units is cooled by circulating the coolant such as water or the like through the trap units, and solid matter (e.g., reaction by-products) is solidified and trapped by cooling the hot exhaust gas. To be more specific, the coolant is supplied to the coolant path 133s from the coolant inlet port 130x of the third trap unit 130 arranged at the downstreammost side of the exhaust trap device and then is discharged through the coolant outlet port 130y. The coolant thus discharged is supplied to the coolant path 123s from the coolant inlet port 120x of the second trap unit 120 arranged at the upstream side of the third trap unit 130 and then is discharged through the coolant outlet port 120y. The coolant thus discharged is supplied to the coolant path 114s from the coolant inlet port 110x of the first trap unit 110 arranged at the upstream most side of the exhaust trap device and then is discharged through the coolant outlet port 110y. The coolant thus discharged is supplied to the coolant path 113s of the first trap unit 110 from the coolant inlet port 110z and then is discharged through the coolant outlet port 110u.

In this way, the coolant paths 113s, 114s, 123s and 133s provided in the respective trap units 110, 120 and 130 of the exhaust trap device 100 are connected in series, and the coolant is sequentially circulated from a coolant path arranged at a more downstream side in the flow direction of the exhaust gas toward a coolant path arranged at a more upstream side. Therefore, a cooling temperature by the coolant path arranged at the more upstream side in the flow direction of the exhaust gas is relatively high and the cooling temperature by the coolant path arranged at the more downstream side is relatively low. Accordingly, the exhaust gas is gradually cooled down to a lower temperature as it moves toward the downstream side along the exhaust route. This makes it possible to distribute the amount of accumulation of the solidified substances over the plurality of exhaust trap sections and thus to relieve uneven distribution in the amount of accumulation of the solidified substances, eventually reducing the frequency of maintenance for the exhaust trap device 100. In the embodiment set forth above, the solidification reaction is promoted by cooling the unreacted gas introduced into the exhaust trap device 100. However, depending on the kind of a gas used, the solidification reaction may be promoted by heating the unreacted gas. In such a case, it will be preferable to circulate a heated medium through the coolant paths 113s, 114s, 123s and 133s of the respective trap units 110, 120 and 130. In this case, it is also possible to relieve uneven distribution in the amount of accumulation of the solidified substances by allowing the heated medium to sequentially circulate from the coolant path (medium path) arranged at the more downstream side in the flow direction of the exhaust gas toward the coolant path (medium path) arranged at the more upstream side.

Furthermore, in the present embodiment, the space 11Zt extends continuously through the exhaust path 11Z, which constitutes one of the inner and outer exhaust trap sections of the first trap unit 110, in the axial direction of the exhaust path 11Z without being interrupted by any of the collision plates 116. Furthermore, the space 12Xt extends continuously through the exhaust path 12X, which constitutes the exhaust trap section of the second trap unit 120 arranged at the downstream side of the first trap unit 110, in the axial direction of the exhaust path 12X without being interrupted by any of the collision plates 124. In addition, the collision plates 134 are arranged in the exhaust trap section of the third trap unit 130 at the downstreammost side in such a manner as to leave no space like the spaces 11Zt and 12Xt.

Accordingly, in the exhaust paths 11Z and 12X of the two upstream side exhaust trap sections, a part of the exhaust gas moves through the spaces 11Zt and 12Xt without being interrupted by any of the collision plates 116 and 124, which leads to reduction in the amount of accumulation of the solid matter solidified from the exhaust gas. On the other hand, in the exhaust path 13X of the exhaust trap section disposed at the downstreammost side, the exhaust gas is sufficiently contacted with the collision plates 134 and therefore the solid matter solidified in that exhaust path is trapped in a reliable manner. This makes it possible to suppress reduction in the conductance or clogging of the exhaust path which would otherwise occur at the upstream side by the intensive accumulation of the solid matter. As a result, it becomes possible to reduce the frequency of maintenance and also to reliably trap the solidified substances in the downstream exhaust trap section, thus avoiding outflow of the solidified components toward the downstream side of the exhaust trap device 100.

In the present embodiment, the rectifying plates 114a, 114b, 114c and 114d are arranged in the exhaust path 11X, which constitutes the upstream exhaust trap section of the two exhaust trap sections of the first trap unit 110, in such a manner as not to hinder the exhaust gas flow. The rectifying plates serve to increase the internal surface area of the exhaust path 11X on which the solid matter solidified from the exhaust gas can be accumulated in a dispersed manner. Thanks to the fact that the rectifying plates are disposed so as not to hinder the exhaust gas flow, it is possible to prevent the solid matter from being intensively accumulated at a part of the exhaust path 11X, which helps to suppress reduction at a part of the exhaust conductance or clogging of the exhaust route. In contrast, the collision plates 116 are arranged within the exhaust path 11Z constituting the downstream exhaust trap section of the first trap unit 110, in such a manner as to hinder and deflect the exhaust gas flow. This reliably improves the efficiency of trapping the solid matter in the exhaust path 11Z.

Accordingly, the first trap unit 110 alone can reduce uneven distribution in the amount of accumulation of the solidified substances and consequently curtail the frequency of maintenance. It is also possible to diminish outflow of the solidified components toward the downstream side of the exhaust trap device 100.

Particularly, the first trap unit 110 includes the path inverting portion 11Y lying between the upstream exhaust path 11X and the downstream exhaust path 11Z. In order to avoid clogging of the path inverting portion 11Y, the path inverting portion 11Y is designed to have a cross sectional communication area greater than those of the upstream exhaust path 11X and the downstream exhaust path 11Z. The reason for this is that the flow direction of the exhaust gas is inverted in the path inverting portion 11Y and hence most of the exhaust gas collides against the inner surface of the path inverting portion 11Y, thereby increasing the amount of the solid matter trapped in the path inverting portion 11Y. However, fins for trapping the solid matter may be provided in the path inverting portion 11Y.

In the first trap unit 110 of the present embodiment, the exhaust paths 11X and 11Z communicating with each other through the path inverting portion 11Y are overlapped one inside the other, and the flow directions of the exhaust gas in the exhaust paths 11X and 11Z are opposite. This helps to make compact the whole device configuration, while securing the cross sectional communication areas of the respective exhaust paths.

In the present embodiment, the exhaust trap section having the exhaust path 11X, the exhaust trap section having the exhaust path 11Z, the exhaust trap section having the exhaust path 12X and the exhaust trap section having the exhaust path 13X are arranged in series. However, exhaust trap sections may be serially arranged in a manner other than the described. For example, in the configuration noted above, one of the second trap unit (the exhaust trap section with the exhaust path 12X) and the third trap unit (the exhaust trap section with the exhaust path 13X) may have the same structure as the other. Furthermore, the exhaust trap device 100 may be formed of only the first and the second trap units or the first and the third trap units. Moreover, the exhaust trap device 100 may be formed of the exhaust trap section having the exhaust path 13X and one of the exhaust trap section having the exhaust path 11Z and the exhaust trap section having the exhaust path 12X only. In addition, the exhaust trap device 100 may be formed of only the exhaust trap section having the exhaust path 11X and one of the exhaust trap section having the exhaust path 11Z, the exhaust trap section having the exhaust path 12X and the exhaust trap section having the exhaust path 13X.

Figure 7:
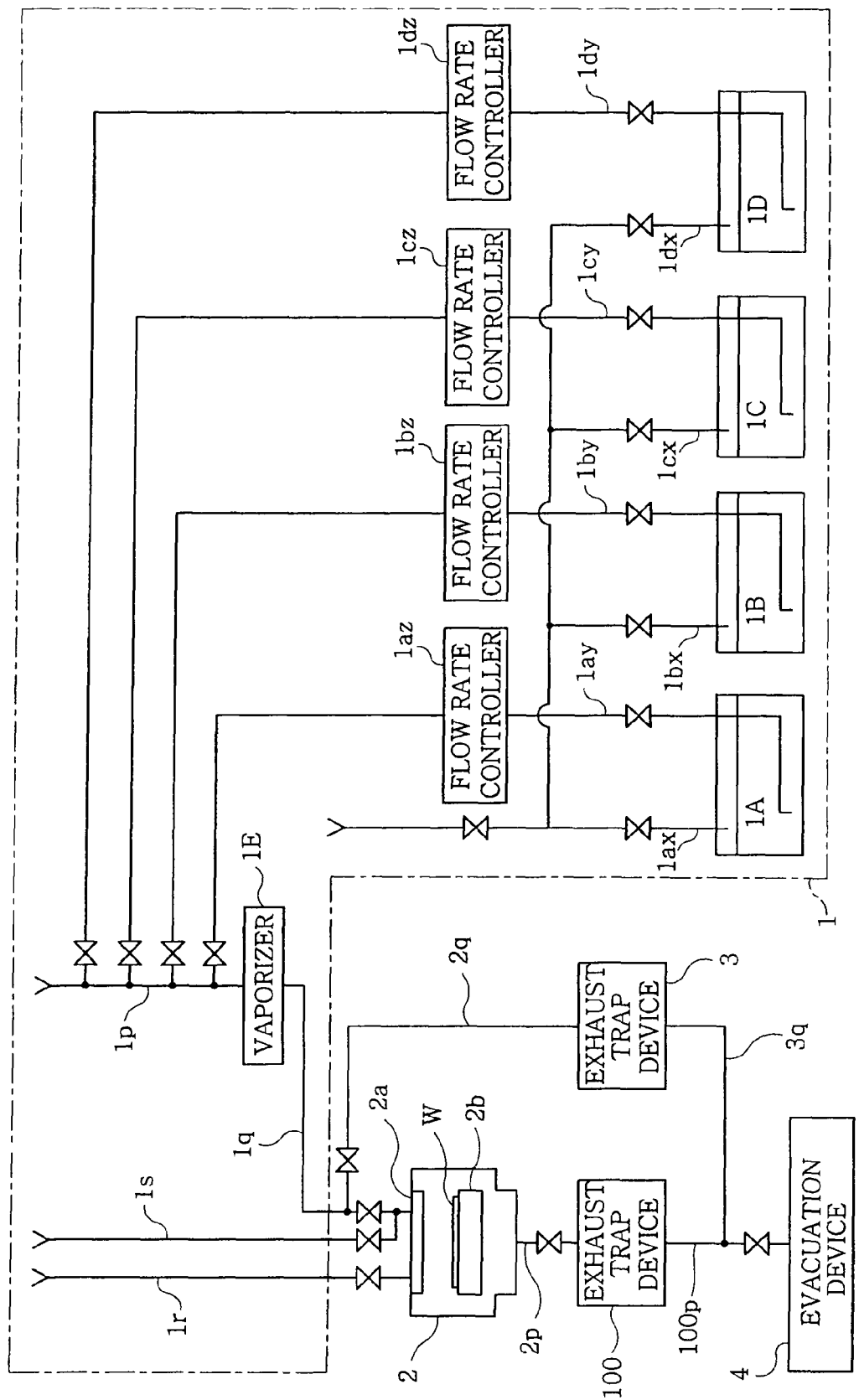
FIG. 7 is a piping diagram illustrating the overall configuration of a gas reaction apparatus in accordance with the present invention.

Next, description will be given to the configuration of a gas reaction apparatus incorporating the exhaust trap device 100 described above. FIG. 7 is a schematic diagram illustrating one exemplary configuration of a gas reaction apparatus in accordance with the present embodiment. The gas reaction apparatus includes a gas supply unit 1, a gas reaction chamber 2, exhaust trap devices 100 and 3, and an evacuation device 4. The gas supply unit 1 is provided with source vessels 1A, 1B and 1C for receiving source materials and a solvent vessel 1D for receiving a solvent such as an organic solvent or the like. For instance, if metal organic compounds (organic metals) of, e.g., Pb, Zr, Ti or the like, are liquids, the source vessel 1A, 1B and 1C accommodate therein the metal organic compounds themselves or diluted ones with a solvent such as an organic solvent or the like, or if they are solids, they are dissolved by a solvent such as an organic solvent or the like and are accommodated in the source vessels 1A, 1B and 1C.

Pressure lines 1$ax$, 1$bx$, 1$cx$ and 1$dx$ for supplying inert gases such as $N_2$, He, Ar or the like or other pressurized gases lead into the source vessels 1A to 1C and the solvent vessel 1D. Whereas outlet pipes 1$ay$, 1$by$, 1$cy$ and 1$dy$ for drawing the liquid source materials or the solvent extend from the source vessels 1A to 1C and the solvent vessel 1D. The outlet pipes 1$ay$ to 1$dy$ are connected to a joint line 1$p$ via mass flow controllers m/z, 1$bz$, 1$cz$ and 1$dz$, respectively. The joint line 1$p$ is connected to a vaporizer 1E.

If the pressurized gases are supplied through the pressure lines 1$ax$ to 1$dx$, the liquid source materials or the solvent are extruded into the outlet pipes 1$ay$ to 1$dy$ and then sent to the joint line 1$p$ with the flow rates thereof controlled by the mass flow controllers m/z to 1$dz$. An inlet gas such as $N_2$, He, Ar or the like or other carrier gas is supplied to the joint line 1$p$. The carrier gas and the liquid source materials or the solvent are mixed into a gas-liquid mixture and then supplied to the vaporizer 1E. The vaporizer 1E has a heated vaporizing chamber into which the liquid source materials are sprayed and vaporized to produce source gases. The source gases are sent to the gas reaction chamber 2 via a source gas supply line 1$q$.

The gas supply unit 1 farther includes a reaction gas supply line 1$r$ connected to the gas reaction chamber 2 in parallel with the source gas supply line 1$q$ and a carrier gas supply line is merged with the source gas supply line 1$q$ immediately ahead of the gas reaction chamber 2. Supplied through the reaction gas supply line 1$r$ is a reaction gas ($O_2$, $NH_4$, $Cl_2$ and so forth) that serves to make a prescribed reaction with the source gas introduced from the source gas supply line 1$q$.

The gas reaction chamber 2 is an air-tight chamber provided with an energy applying unit such as a heating unit, e.g., a heater or the like, or an electric discharge unit, e.g., a discharging part or the like. Arranged within the air-tight chamber are a gas inlet unit 2$a$ (e.g., a part having a multiplicity of gas inlet holes just like a shower head), and a susceptor 2$b$ kept in a confronting relationship with the gas inlet unit 2$a$. A substrate W formed of a semiconductor substrate or the like is mounted on the susceptor 2$b$. In the present embodiment, the source gas and the reaction gas introduced from the gas inlet unit 2$a$ are properly reacted with each other in the air-tight chamber by attaining the energy applied by the energy applying unit, forming a given thin film on the surface of the substrate W. Here, if a PZT thin film is to be formed on the substrate W for instance, the substrate temperature is usually about 500-700□ and the temperature of the exhaust gas discharged from the gas reaction chamber 2 is approximately 200□.

An exhaust line 2$p$ is connected to the air-tight chamber and leads to the exhaust trap device 100 set forth earlier. The exhaust trap device 100 is connected to an exhaust line loop, which is connected to an evacuation device 4 formed of a vacuum pump or the like. The source gas supply line 1$q$ is connected to a bypass line 2$q$ just ahead of the gas reaction chamber 2, which leads to an exhaust trap device 3. The exhaust trap device 3 is connected to the exhaust line loop via a bypass line 3$q$.

The gas reaction chamber 2 is decompressed through the exhaust line 2$p$, the exhaust trap device 100 and the exhaust line loop by virtue of the evacuation device 4 and is kept at a predetermined pressure. As the afore-mentioned reaction occurs within the gas reaction chamber 2, the exhaust gas is discharged toward the evacuation device 4 through the exhaust trap device 100 where the reaction by-products are trapped. Here, the source gas supplied through the source gas supply line 1$q$ from the gas supply unit 1 is bypassed to the evacuation device 4 via the bypass line 2$q$, the exhaust trap device 3 and the bypass line 3$q$, until the composition of the source gas is stabilized and the gas reaction chamber 2 becomes ready for operation or after the reaction in the gas reaction chamber 2 has been completed. The gas bypassed at this time is the source gas itself that does not pass through the gas reaction chamber 2. Solidified substances are also trapped by the exhaust trap device 3 from the source gas.

Although FIG. 7 shows an example wherein the exhaust trap device 100 of the present invention is connected to the exhaust route of the gas reaction chamber 2, the exhaust trap device 100 may be employed as the exhaust trap device alternatively arranged in the middle of the exhaust route (bypass line) connected to the gas supply unit 1 to trap the source gas, just like the exhaust trap device 3.

It should be understood that the exhaust trap device and the gas reaction apparatus of the present invention are not restricted to the embodiment shown and described above but may be modified in many different ways without departing from the scope of the invention. Taking an example, the axes of the exhaust paths constituting the respective exhaust trap sections may be of a curved shape or an angled shape, although they are formed in a rectilinear shape in the exhaust trap device 100 of the aforementioned embodiment.

In place of the plurality of collision plates arranged in the exhaust paths, an integrally formed spiral collision plate (screw-like collision plate) whose axis coincides with the axis of each of the exhaust paths may be provided. In this case, a gap may be left between the inner or outer circumference of the spiral collision plate and the wall of the corresponding exhaust path, thereby providing the same space as the above-noted spaces 11Zt and 12Xt in the exhaust path.

Although the spaces 11Zt and 12Xt are all provided at the centers portions of the exhaust paths, they may be formed along the outer portions circumferences of the exhaust paths or may be created by forming through-holes on the collision plates.

A film forming apparatus for forming a thin film on a substrate has been described as an example of the gas reaction apparatus. The film forming system may be exemplified by cases forming a TiN film by the reaction of $TiCl_4$ and $NH_3$ to produce $NH_4CL$ as a reaction by-product; a SiN film by the reaction of $SiH_4$ or $SiH_2Cl_2$ and $NH_3$ to produce $NH_4Cl$ as a reaction by-product; a WN film by the reaction of $WF_6$ and $NH_3$ to produce $NH_4F$ as a reaction by-product; a TaN film by the reaction of $TaCl_4$ and $NH_3$ to produce $NH_4Cl$ as a reaction by-product; and other metal oxide films. Objects trapped are not restricted to the reaction by-products described above but may include an excess reaction gas remaining unreacted. The present invention may be equally applied to other gas reaction apparatuses than the film forming apparatus for semiconductor devices, e.g., a dry etching apparatus or an apparatus for the production of LCD.

What is claimed is:

1. An exhaust trap device for trapping solidified substances from an exhaust gas passing through a gas exhaust route, comprising:
    a plurality of exhaust trap sections arranged in series along the exhaust route, each section having an internally formed exhaust path through which the exhaust gas passes,
    wherein the plurality of exhaust trap sections includes a first exhaust trap section arranged at an upstream side in a flow direction of the exhaust gas and a second exhaust trap section arranged at a downstream side in the flow direction of the exhaust gas,
    wherein each of the first and the second exhaust trap section is provided with one or more collision plates, and
    wherein angles that an axis of an exhaust path formed in the second exhaust trap section makes with respect to the collision plates in the second exhaust trap section are greater than angles that an axis of an exhaust path formed in the first exhaust trap section makes with respect to the collision plates in the first exhaust trap section.

2. The exhaust trap device of claim 1, wherein the first and the second exhaust trap section are arranged such that one section is disposed outside the other to surround same and a path inverting portion for inverting the flow direction of the exhaust gas is provided between the first exhaust trap section and the second exhaust trap section.

3. The exhaust trap device of claim 2, wherein the path inverting portion is connected with the entire perimeters of the first exhaust trap section and the second exhaust trap section.

4. The exhaust trap device of claim 1, wherein the collision plates are arranged to allow the exhaust gas to spirally flow within the exhaust path in which the collision plates are arranged.

5. A gas reaction apparatus comprising:
    the exhaust trap device as recited in claim 1.

6. The gas reaction apparatus of claim 5, further comprising:
    a gas supply unit;
    a gas reaction chamber in which gases supplied from the gas supply unit are reacted; and
    an exhaust route associated with the gas supply unit or the gas reaction chamber,
    wherein the exhaust trap device being arranged on the exhaust route.

7. The exhaust trap device of claim 3, wherein the collision plates in the second exhaust trap section are arranged such that a space extending continuously along the axis of the exhaust path of the second exhaust trap section without being interrupted by any of the collision plates arranged within the exhaust path of the second exhaust trap section does not exist in the exhaust path of the second exhaust trap section.

8. The exhaust trap device of claim 3, wherein the collision plates in the second exhaust trap section are arranged such that a space extending continuously along the axis of the exhaust path of the second exhaust trap section without being interrupted by any of the collision plates arranged within the exhaust path of the second exhaust trap section exists in the exhaust path of the second exhaust trap section.

9. The exhaust trap device of claim 1, wherein the collision plates in the first exhaust trap section extend in an axial direction of the exhaust path formed in the first exhaust trap section.

10. The exhaust trap device of claim 1, wherein each of the collision plates in the second exhaust trap section is arranged on a plane perpendicularly intersecting the axis of the exhaust path formed in the second exhaust trap section.

11. The exhaust trap device of claim 1, wherein a collision plate in the first exhaust trap section located farther from a gas inlet port extends closer to an end plate of the exhaust trap device than a collision plate in the first exhaust trap section located closer to the gas inlet port.

12. The exhaust trap device of claim 1, wherein a collision plate in the first exhaust trap section located closer to a gas inlet port protrudes into the first exhaust trap section in a smaller amount than a collision plate in the first exhaust trap section located farther from the gas inlet port.

\* \* \* \* \*